United States Patent [19]
Neidorff

[11] Patent Number: 4,755,793
[45] Date of Patent: Jul. 5, 1988

[54] INPUT RANGING DIVIDER AND METHOD FOR AN ANALOG TO DIGITAL CONVERTER

[75] Inventor: Robert A. Neidorff, Chandler, Ariz.
[73] Assignee: Motorola, Inc., Schaumburg, Ill.
[21] Appl. No.: 398,530
[22] Filed: Jul. 15, 1982
[51] Int. Cl.[4] .............................................. H03M 1/18
[52] U.S. Cl. ........................ 340/347 AD; 340/347 M; 323/369
[58] Field of Search ................ 340/347 AD, 347 CC, 340/347 M; 323/369

[56] References Cited

U.S. PATENT DOCUMENTS 3,125,677  3/1964  Newell ............................ 323/369 X
3,646,548  2/1972  Van Doren .................. 340/347 AD

OTHER PUBLICATIONS

Schmid, Electronic Analog/Digital Conversions, Van Nostrand Reinhold, 1970, pp. 240–247.
Precision Resistor Networks, Micro Networks Corporation, 1/1976, 4 pp.
The Engineering Staff of Analog Devices, Inc., Analog-Digital Conversion Handbook, 6/1972, pp. II-83 to II-87; III-1 to III-15.
12 Bit Hybrid A/D Converter Data Sheets, Data Device Corp., 2/1979, pp. 1–5.
The Engineering Staff of Analog Devices, Inc., Analog-Digital Conversion Handbook, 6/1972, pp. II-32 to II-35.

*Primary Examiner*—T. J. Sloyan
*Attorney, Agent, or Firm*—Vincent B. Ingrassia

[57] ABSTRACT

An improved input ranging divider and method for an analog to digital converter in which a floating common input line to the A to D comparator is coupled through an R/2R resistive input ladder. A constant reference voltage is applied to the other comparator input. By applying an input voltage to a certain input terminal or terminals of the input ranging divider, while the remaining terminals are either grounded or left floating, a wide range of diverse operating ranges may be made available to an A to D converter while utilizing only a small overall number of inputs.

15 Claims, 2 Drawing Sheets

| RANGE | | INPUT CONNECTIONS | | |
|---|---|---|---|---|
| FROM | TO | X | Y | Z |
| 0.0 | 10.0 | INPUT | OPEN | OFF |
| 0.0 | 20.0 | OPEN | INPUT | OFF |
| −5.0 | +5.0 | INPUT | OPEN | ON |
| −10.0 | +10.0 | OPEN | INPUT | ON |

| RANGE | | INPUT CONNECTIONS | | | |
|---|---|---|---|---|---|
| FROM | TO | A | B | C | D |
| 0.0 | 2.5 | INPUT | OPEN | OPEN | OPEN |
| 0.0 | 5.0 | OPEN | INPUT | INPUT | GROUND |
| −5.0 | 5.0 | OPEN | INPUT | GROUND | OPEN |
| 0.0 | 10.0 | OPEN | INPUT | GROUND | GROUND |
| 0.0 | 2.5 | OPEN | INPUT | INPUT | INPUT |
| 2.5 | 7.5 | GROUND | OPEN | OPEN | INPUT |
| −1.25 | 6.25 | OPEN | OPEN | INPUT | GROUND |
| 5/6 | 2.5 | INPUT | OPEN | OPEN | INPUT |
| 5/6 | 1.6667 | OPEN | GROUND | OPEN | INPUT | ial to digital (A to D) converters and methods. More particularly, the
INPUT RANGING DIVIDER AND METHOD FOR AN ANALOG TO DIGITAL CONVERTER

BACKGROUND OF THE INVENTION

The present invention relates to analog to digital (A to D) converters and methods. More particularly, the present invention relates to A to D converters and methods in which a plurality of inputs are provided which may be selectively grounded, left floating or tied to an applied voltage to supply various operational voltage ranges for the A to D converter.

Previously there has been disclosed an A to D converter which provided more than one operating range by means of two separate power supplies. By selectively applying an input voltage to either of two input terminals provided while digitally switching the second of the two power supplies, bipolar and unipolar input ranges could be provided. However, the use of the second switched current source with its concomitant digital switching has disadvantages. Moreover, the number of operating ranges available to an A to D converter as previously disclosed has been limited.

It is therefore an object of the present invention to provide an improved input ranging divider and method for an analog to digital converter.

It is still further an object of the present invention to provide an improved input ranging divider and method for an analog to digital converter which requires only a single power supply, obviating its digital switching, yet provides operational ranges above and below supply voltage and of the same and opposite polarity.

It is still further an object of the present invention to provide an improved input ranging divider and method for an analog to digital converter which provides a wide number of diverse operational ranges utilizing only a small number of device pins.

SUMMARY OF THE INVENTION

The aforementioned objects are achieved in the present invention wherein an improved input ranging divider and method for an analog to digital converter is provided. A floating common input line to the A to D comparator is coupled through an R/2R resistive input ladder. A constant reference voltage is applied to the other comparator input. By applying an input voltage to a certain input terminal or terminals of the input ranging divider, while the remaining terminals are either grounded or left floating, a wide range of diverse operating ranges may be made available to an A to D converter while utilizing only a small overall number of inputs.

BRIEF DESCRIPTION OF THE DRAWINGS

The above mentioned and other features and objects of the invention and the manner of attaining them become more apparent and the invention itself will be best understood by reference to the following description of an embodiment of the invention taken in conjunction with the accompanying drawings, wherein.

DESCRIPTION OF A PREFERRED EMBODIMENT

Figures 1A, 1B:
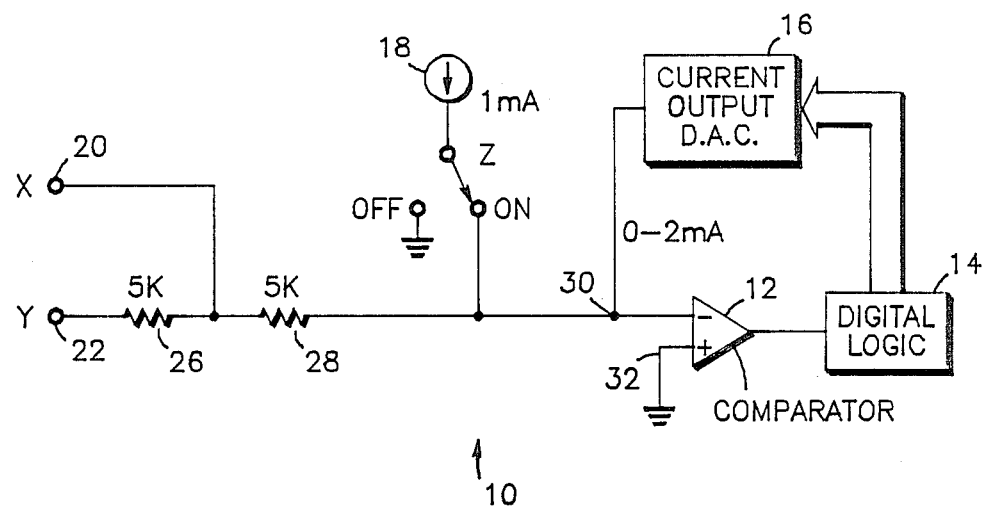
FIG. 1A is a simplified schematic representation of a prior art A to D converter illustrating the two input connections thereto and a digitally switched second power supply comprising a current source.
FIG. 1B is a tabular representation of the operating ranges for the A to D converter of FIG. 1A according to the input terminal selected and condition of the digitally switched current source.

Referring now to FIGs. 1A and 1B, a prior art A to D converter 10 is shown. Prior art A to D converter comprises in pertinent part a comparator 12 the output of which is supplied to a digital logic circuit 14. Digital logic circuit 14 provides a successive approximation logic for an analog to digital conversion the output of which is supplied as input to current output digital to analog converter (D.A.C.) 16. The output of current output D.A.C. 16 is then supplied as one input to inverting input 30 to comparator 12. Also furnished as input to inverting input 30 is the output of switched current source 18 as coupled through Z digital switch 24 when in the "ON" position.

Switched current source 18 may also be switched to the "OFF" position by means of Z digital switch 24.

A voltage input to prior art A to D converter 10 is furnished on either X input 20 or Y input 22. X input 20 is supplied to inverting input 30 through resistor 28. An input voltage to Y input 22 is coupled to inverting input 30 through series connected resistors 26 and 28. As shown, the noninverting input 32 of comparator 12 is connected to circuit ground.

Providing a 0.0 to 2.0 mA output of current output D.A.C. 16; a 1.0 mA output of switched current source 18 and 5K ohm resistors for resistors 26 and 28, various input ranges for the prior art A to D converter 10 may be established. These various input ranges depend on whether the input voltage is applied to X input 20 or Y input 22 in conjunction with the position of Z digital switch 24. As shown, a range of from 0.0 to 10.0 volts is established when an input voltage is applied to X input 20 while Y input 22 floats and Z digital switch 24 is in the "OFF" position. Similarly, a 0.0 to 20.0 volt range is established when the input voltage is applied to Y input 22 while X input 20 is allowed to float with Z digital switch 24 also in the "OFF" position. To establish an operational range extending to less than 0 volts at the low end, it is necessary to apply the output of switched current source 18 to inverting input 30 of comparator 12 by means of Z digital switch 24. With Z digital switch 24 in the "ON" position, an input range of from −5.0 to +5.0 volts is established when the input voltage is applied to X input 20 while Y input 22 floats. In like manner, an operational range of from −10.0 to +10.0 volts is established when the input voltage is applied to Y input 22 and X input 20 is allowed to float.

System Description

Figures 2A, 2B:
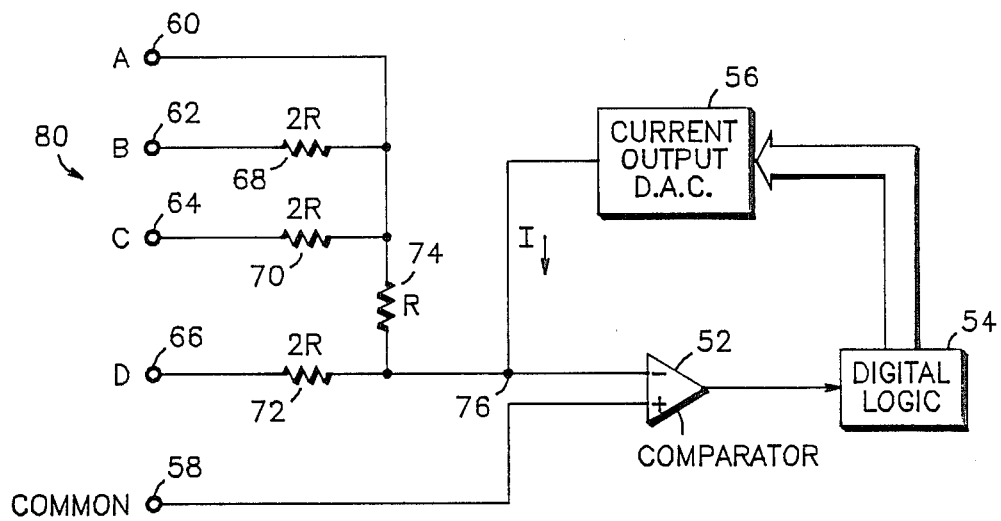
FIG. 2A is a simplified schematic representation of an improved A to D converter according to the present invention illustrating the input ranging divider thereof.
FIG. 2B is a tabular representation of the various operating ranges provided by the improved A to D converter of FIG. 2A according to the input terminal or terminals selected and condition of the remaining input terminals.

Referring now to FIG. 2A, an improved A to D converter 50 is shown. As illustrated, improved A to D converter 50 comprises a comparator 52 the output of which is coupled to a digital logic circuit 54. The output of digital logic circuit 54 provides a successive approximation logic for an analog to digital conversion as applied to the input of current output D.A.C. 56. The current output of current output D.A.C. 56 is applied to inverting input 76 of comparator 52. Also connected to inverting input 76 of comparator 52 is an input ranging divider 80.

Input ranging divider 80 comprises in pertinent part an R/2R resistive ladder. As shown, A input 60 is coupled to inverting input 76 through resistor 74. B input 62 and C input 64 are coupled to A input 60 through respective resistors 68 and 70. D input 66 is coupled through resistor 72 to inverting input 76. A reference voltage is applied to the noninverting input of comparator 52 on common line 58.

System Operation

Referring additionally now to FIG. 2B, some representative operating ranges for the specific embodiment of the improved A to D converter 50 shown in FIG. 2A are given. In this exemplary tabulation, it is assumed that 0–1 mA of current is available at the inverting input of comparator 52 from the output of current output D.A.C. 56; 2.5 volts is applied to common line 58 to the noninverting input of comparator 52; and, resistors 68, 70 and 72 are each 5K ohm resistors and the value of resistor 74 is 2.5K ohm. The 2.5 volt reference voltage can easily be provided on-chip in an integrated version of improved A to D converter 50.

Utilizing A input 60 as an input line and allowing B input 62, C input 64 and D input 66 to float will provide an operating range of 0.0 to 2.5 volts. For a full 1 mA output of current output D.A.C. 56 it is readily seen that the full 2.5 volts available would be dropped across resistor 74 while for 0 mA current output, A input 60 would have to be at the same potential as inverting input 76, or 2.5 volts. Alternatively, the same 0 to 2.5 volt range could be provided by supplying the input simultaneously to B input 62, C input 64, and D input 66 while allowing A input 60 to float. Thus, resistors 68 and 70 would be in parallel and equivalent to the resistance of resistor 74 with which the combination is in series. Together resistors 68, 70 and 74 are equivalent in value to the parallel connected resistor 72 which also is an input thereby making the total resistance provided to the input by input ranging divider 80 equal to 2.5K ohms as was the above-described case.

Utilizing B input 62 and C input 64 as inputs while leaving A input 60 floating and grounding D input 66 provides a 0.0 to 5.0 volt operating range. In this case, resistors 68 and 70 are placed in parallel thereby having a combined resistance equal to resistor 74 with which the combination is in series. Thus the equivalent circuit provided by input ranging divider 80 is an input to inverting input 76 through 5K ohms which point is also tied to ground through 5K ohms by D input 66. Thus, the full 1 mA current available from current output D.A.C. 56 will be provided across a resistance equal to a total of 2.5K ohms when B input 62 and C input 64 are at a 0.0 voltage level or ground as is D input 66. Alternatively, to provide a 2.5 volt level at inverting input 76 with 0 mA out of current output D.A.C. 56, it is readily seen that the equivalent circuit provided by this configuration of the inputs to input ranging divider 80 will do so with a 5 volt input dividing the voltage equally across resistor 72 and the parallel connected resistors 68 and 70 in series with resistor 74.

It is also possible by means of the improved A to D converter 50 to provide input ranges of opposite polarity to the voltage supplied. In this regard an input may be supplied to B input 62 while C input 64 is grounded with A input 60 and D input 66 left floating. Configured as described, input ranging divider 80 will then place a full 1 mA through resistor 74 such that the voltage drop across it is 2.5 volts (1 mA × 2.5K ohms) placing the line to A input 60 at 0 volts or circuit ground. Thus, no current will flow through resistor 70 to grounded C input 64 and the full 1 mA current will flow through resistor 68 producing a voltage drop of 5 volts (1 mA × 5.0K ohms) with respect to 0 volts or −5 volts. Alternatively, for 0 mA current flow out of current output D.A.C. 56 the line connected to A input 60 would have to be placed at a potential of 2.5 volts as would be the case when 5.0 volts is equally dropped across equal value, series connected resistors 68 and 70.

In another configuration of the inputs to input ranging divider 80, a 0 to 10 volt operating range may be provided by supplying an input to B input 62 while C input 64 and D input 66 are grounded. A input 60 is allowed to float. Thus for 1 mA of current out of current output D.A.C. 56 it would be necessary to drop 2.5 volts across resistor 72 which would be the case with 0.5 mA of current therethrough (0.5 mA × 5.0K ohms). This necessitates an equivalent resistance provided by the combination of resistors 68, 70 and 74 to equally divide the 1 mA current. Thus, B input 62 must be placed at 0.0 volts such that resistors 68 and 70 are in parallel and equivalent to 2.5K ohms which is then in series with resistor 74 for a total of 5.0K ohms. For 0 mA current out of current output D.A.C. 56, inverting input 76 must be driven to 2.5 volts with respect to grounded D input 66 thus necessitating 0.5 mA of current through resistor 72. Therefore, the same 0.5 mA current must also flow through resistor 74 such that the line connected to floating A input 60 must be 1.25 volts higher (0.5 mA × 2.5K ohms) than 2.5 volts, or 3.75 volts. With this point at this potential, 0.75 mA of current must flow to circuit ground through resistor 70 (3.75 volts ÷ 5K ohms). Therefore, a total of 1.25 mA of current must be available on the line connected to floating A input 60 (0.5 mA + 0.75 mA). This same current would also have been passed from B input 62 through resistor 68 such that 6.25 volts was dropped thereacross (1.25 mA × 5K ohms). Thus, B input 62 must be 6.25 volts greater than the 3.75 volts appearing on the line connected to floating A input 60 or 10.0 volts (6.25 volts + 3.75 volts).

It is apparent that the aforementioned values may be modified relative to each other to suit individual circuit requirements, such as providing 0–0.5 mA at the output of current output D.A.C. 56 while doubling the resistance values of resistors 68, 70, 72 and 74 without affecting the input ranges specified in FIG. 2B. Numerous other combinations of connections to input ranging divider 80 are also possible including the addition of any number of additional resistive inputs which may be used as inputs, grounded or left floating. Inputs may also be provided either directly to, or resistively to, inverting input 76 such that resistor 74 is bypassed. Additionally, it is further apparent that any desired value or number of input ranges can be provided depending on the current, voltage and resistance values chosen without departing from the spirit and scope of the present invention.

What has been provided, therefore, is an improved input ranging divider and method for an A to D converter which requires only a single power supply with no digital switching yet provides operational ranges above and below supply voltage and of the same or opposite polarity thereto. Further, the present invention provides a wide number of diverse operational ranges utilizing only a small number of inputs.

While there have been described above the principles of this invention in conjunction with specific apparatus, it is to be clearly understood that this description is made only by way of example and not as a limitation to the scope of the invention.

I claim:

1. An input ranging divider for providing a plurality of operating ranges to an analog to digital converter comprising:

first, second, third and fourth input terminals, said first input terminal being connected to said converter through a first resistor, said second and third input terminals being connected to said first input terminal through respective second and third resistors, and said fourth input terminal being connected to said converter through a fourth resistor.

2. The input ranging divider of claim 1 wherein said first resistor is of less resistance than said second, third and fourth resistors.

3. The input ranging divider claim 2 wherein said first resistor is substantially one-half the resistance of said second, third, and fourth resistors.

4. The input ranging divider of claim 1 wherein said analog to digital converter further comprises:

a comparator having inverting and noninverting inputs thereof, said inverting input being connected to said first and fourth resistors and receiving a variable current output of a current output D.A.C. and said noninverting input being coupled to a reference voltage.

5. The input ranging divider of claim 4 wherein said first resistor is substantially equal to a resistance defined by said reference voltage divided by a maximum current value of said variable current output.

6. The input ranging divider of claim 5 wherein said first resistor is substantially 2.5K ohms.

7. A method for establishing a plurality of operating ranges for an analog to digital converter having an input comparator comprising the steps of:

providing an input ranging divider for coupling a variable voltage level to said converter, said input ranging divider having a plurality of resistively coupled input terminals thereto, coupling said input ranging divider to a first input of said input comparator having as an additional input thereto a variable current source, furnishing a reference voltage to a second input of said input comparator, applying said variable voltage level to at least one of said plurality of resistively coupled input terminals, and allowing selected remaining ones of said plurality of resistively coupled input terminals to electrically float.

8. The method of claim 7 further comprising the steps of:

selectively grounding some of said remaining ones of said plurality of resistively coupled input terminals.

9. The method of claim 7 wherein said step of providing is carried out by means of a resistive network having resistances bearing a relative relationship of R to 2R where R is the resistance in ohms.

10. The method of claim 7 wherein said step of furnishing is carried out by means of a reference voltage of substantially 2.5 volts.

11. An analog to digital converter including an input ranging divider for providing a plurality of operating ranges thereto comprising:

first, second, third and fourth input terminals, said first input terminal being connected to said converter through a first resistor, said second and third input terminals being connected to said first input terminal through respective second and third resistors, and said fourth input terminal being connected to said converter through a fourth resistor; and a comparator having inverting and noninverting inputs thereof, said inverting input being connected to said first and fourth resistors and receiving a variable current output of a current output D.A.C., said noninverting input being coupled to a reference voltage.

12. The analog to digital converter of claim 11 wherein said first resistor is of less resistance than said second, third and fourth resistors.

13. The analog to digital converter of claim 12 wherein said first resistor is substantially one-half the resistance of said second, third, and fourth resistors.

14. The analog to digital converter of claim 11 wherein said first resistor is substantially equal to a resistance defined by said reference voltage divided by a maximum current value of said variable current output.

15. The analog to digital converter of claim 14 wherein said first resistor is substantially 2.5K ohms.

* * * * *